(12) United States Patent
Sugai

(10) Patent No.: US 8,637,872 B2
(45) Date of Patent: Jan. 28, 2014

(54) SEMICONDUCTOR DEVICE AND METHOD OF MANUFACTURING SEMICONDUCTOR DEVICE

(75) Inventor: Akihiko Sugai, Hanno (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 13/129,890

(22) PCT Filed: Oct. 23, 2009

(86) PCT No.: PCT/JP2009/005606
§ 371 (c)(1),
(2), (4) Date: May 18, 2011

(87) PCT Pub. No.: WO2010/058524
PCT Pub. Date: May 27, 2010

(65) Prior Publication Data
US 2011/0220918 A1    Sep. 15, 2011

(30) Foreign Application Priority Data
Nov. 19, 2008    (JP) .................. 2008-295826

(51) Int. Cl.
*H01L 29/872* (2006.01)
*H01L 21/329* (2006.01)

(52) U.S. Cl.
USPC  257/77; 438/571; 257/E29.338; 257/E21.359

(58) Field of Classification Search
USPC ............. 257/77, 155, 471, 483, E29.338, 257/21.047, E29.148, E21.163, 21.073; 438/534, 571, 572, 573, 578, 931, 570, 438/701, 713, 714, 735, 737–739, 438/FOR. 173, FOR. 335
See application file for complete search history.

(56) References Cited

U.S. PATENT DOCUMENTS 5,214,003 A * 5/1993 Shimakura et al. .......... 438/590
5,789,311 A    8/1998 Ueno et al.
(Continued)

FOREIGN PATENT DOCUMENTS

| JP | 57-124438 A | 8/1982 |
|---|---|---|
| JP | 6-112474 A | 4/1994 |

(Continued)

OTHER PUBLICATIONS

Peter Van Zant, Microchip Fabrication, 2004, McGraw-Hill, McGraw-Hill, p. 260, chapter 9, Overetch and undercutting.*

(Continued)

*Primary Examiner* — Kimberly Rizkallah
*Assistant Examiner* — Mounir Amer
(74) *Attorney, Agent, or Firm* — Sughrue Mion, PLLC

(57) ABSTRACT

A high-performance semiconductor device capable of suppressing a leak current with little electric field concentration, reducing an invalid region in a PN junction region, securing a sufficient area for a Schottky junction region, and achieving efficient and easy manufacturing, in which, in one surface of a semiconductor substrate (1) having a first conduction type made of SiC, a PN junction region (7a) and a Schottky junction region (7b) are provided, in the PN junction region (7a), a convex portion (2a) which has a trapezoidal shape in sectional view and includes a second conduction type layer (2) provided on the semiconductor substrate (1) and a contact layer (3) which is in ohmic contact with the second conduction type layer (2) of the convex portion (2a) are provided, and Schottky electrode (4) covers the side surface of the convex portion (2a) and the contact layer (3), and is provided continuously over the PN junction region (7a) and the Schottky junction region (7b).

8 Claims, 4 Drawing Sheets

(56) References Cited

U.S. PATENT DOCUMENTS

| | | | |
|---|---|---|---|
| 6,307,244 B1* | 10/2001 | Shikata | 257/471 |
| 6,844,251 B2 | 1/2005 | Shenai et al. | |
| 7,015,518 B2* | 3/2006 | Kobayashi | 257/194 |
| 7,274,083 B1* | 9/2007 | Sankin et al. | 257/471 |
| 7,745,273 B2* | 6/2010 | Treu et al. | 438/186 |
| 2003/0151063 A1 | 8/2003 | Kobayashi | |
| 2005/0263788 A1* | 12/2005 | Kunii et al. | 257/192 |
| 2007/0170436 A1* | 7/2007 | Sugawara | 257/77 |
| 2007/0278609 A1 | 12/2007 | Harris et al. | |
| 2008/0160685 A1 | 7/2008 | Sankin et al. | |
| 2008/0277668 A1* | 11/2008 | Okuno et al. | 257/77 |
| 2009/0230405 A1* | 9/2009 | Yamamoto et al. | 257/77 |

FOREIGN PATENT DOCUMENTS

| | | |
|---|---|---|
| JP | 7-66433 A | 3/1995 |
| JP | 8-97441 A | 4/1996 |
| JP | 8-236791 A | 9/1996 |
| JP | 2000-58874 A | 2/2000 |
| JP | 2000-252478 A | 9/2000 |
| JP | 2009-224603 A | 10/2009 |
| WO | 03/077306 A1 | 9/2003 |

OTHER PUBLICATIONS

Extended European Search Report dated Oct. 19, 2012, issued from the European Patent Office, in corresponding European Patent Application No. 09 82 7305.5.

J.H. Zhao, et al.; "3.6 m$\Omega$cm$^2$, 1726 V 4-H-SiC Normally-off Trenched-and-Implanted Vertical JFETs"; ISPSD 2003, Apr. 14-17, Cambridge, UK; pp. 50-53.

Office Action dated Aug. 31, 2012, issued from the Chinese Patent Office, in corresponding Chinese Patent Application No. 200980145836.8, along with an English translation thereof.

* cited by examiner

SEMICONDUCTOR DEVICE AND METHOD OF MANUFACTURING SEMICONDUCTOR DEVICE

TECHNICAL FIELD

The present invention relates to a semiconductor device and a method of manufacturing a semiconductor device, and in particular, to a semiconductor device which is appropriately used for a power semiconductor device and a method of manufacturing a semiconductor device.

This application claims priority based on Japanese Patent Application No. 2008-295826, filed on Nov. 19, 2008, the content of which is incorporated herein by reference.

BACKGROUND ART

As a power semiconductor device which is used for power conversion or the like, a Schottky barrier diode (SBD) is known which uses the Schottky metal-semiconductor junction (for example, see PTL 1 and PTL 2). The SBD is a majority carrier device. Thus, when a large forward surge current flows, a forward voltage drop may increase, resulting in element destruction.

An SBD is also known which uses a SiC semiconductor substrate (for example, see PTL 3).

RELATED ART LIST

Patent Literature

[PTL 1] JP-A-6-112474
[PTL 2] JP-A-8-236791
[PTL 3] JP-A-2000-252478

SUMMARY OF INVENTION

Technical Problem

As a method of improving durability against element destruction due to the forward surge current, a method is considered which provides a semiconductor device with the Schottky junction and the PN junction combined, and lowers a forward voltage drop by minority carrier implantation from the PN junction. In order for minority carrier implantation from the PN junction to be smoothly carried out, an electrode which comes into contact with a P-type region of the semiconductor device and the P-type region should form ohmic contact.

However, in an SBD using a SiC semiconductor substrate, there is a problem in that a Schottky electrode which forms a Schottky contact with an N-type region does not easily form satisfactory ohmic contact with a P-type region.

In an SBD using a SiC semiconductor substrate, in order to form a Schottky electrode which forms Schottky contact with an N-type region and forms satisfactory ohmic contact with a P-type region, a method is considered which provides a semiconductor device with a contact metal film arranged between the P-type region and the Schottky electrode. The problems of the semiconductor device of the related art in which the contact metal film is arranged between the P-type region and the Schottky electrode will be described with reference to FIGS. 4A to 4C. FIG. 4A is a sectional view showing an example of a semiconductor device of the related art. FIGS. 4B and 4C are process views illustrating an example of a manufacturing process of the semiconductor device shown in FIG. 4A.

In FIG. 4A, reference numeral 11 denotes an N-type semiconductor substrate made of SiC. The N-type semiconductor substrate 11 is made of an $N^+SiC$ layer 11a, and an $N^-SiC$ layer 11b is formed on the $N^+SiC$ layer 11a. In the surface of the N-type semiconductor substrate 11 on the $N^-SiC$ layer 11b side, a PN junction region 17a where P-type regions 12 are provided to form a PN junction with the N-type semiconductor substrate 11, and a Schottky junction region 17b where a Schottky electrode 14 is in Schottky contact with the $N^-SiC$ layer 11b of the N-type semiconductor substrate 11 are provided.

As shown in FIG. 4A, a plurality of P-type regions 12 having a rectangular shape in sectional view are formed so as to be buried in the PN junction region 17a. A contact metal film 13 is formed on each P-type region 12 so as to have a plane area smaller than the P-type region 12. The contact metal film 13 forms satisfactory ohmic contact with the P-type region 12. As shown in FIG. 4A, the Schottky electrode 14 covers each contact metal film 13 and is provided continuously over the PN junction region 17a and the Schottky junction region 17b. Thus, in the semiconductor device shown in FIG. 4A, the contact metal film 13 is arranged between the P-type region 12 and the Schottky electrode 14 in the PN junction region 17a. An ohmic electrode 15 which is in ohmic contact with the $N^+SiC$ layer 11a of the N-type semiconductor substrate 11 is provided in the surface of the N-type semiconductor substrate 11 on the $N^+SiC$ layer 11a side (in FIG. 4, on the lower side).

As a method of manufacturing the semiconductor device shown in FIG. 4A, the following method or the like may be used. First, a mask (not shown) which covers a region serving as the Schottky junction region 17b is formed on the N-type semiconductor substrate 11 which has the $N^+SiC$ layer 11a and the $N^-SiC$ layer 11b formed on the $N^+SiC$ layer 11a, a P-type impurity is ion-implanted into a region serving as the PN junction region 17a of the N-type semiconductor substrate 11, and the mask is removed. Next, heat treatment is carried out at a high temperature so as to diffuse and activate the P-type impurity ion-implanted into the N-type semiconductor substrate 11. Thus, as shown in FIG. 4B, a plurality of P-type regions 12 having a rectangular shape in sectional view are formed which are buried in the N-type semiconductor substrate 11 and form the PN junction with the N-type semiconductor substrate 11.

Thereafter, as shown in FIG. 4B, the ohmic electrode 15 is formed on the $N^+SiC$ layer 11a side of the N-type semiconductor substrate 11.

Subsequently, a metal film serving as the contact metal film 13 is formed on the P-type region 12, and heat treatment is carried out so as to form satisfactory ohmic contact with the P-type region 12. Next, a mask (not shown) is formed on the metal film serving as the contact metal film 13 so as to cover a region which overlaps the P-type region 12 in plan view, the metal film serving as the contact metal film 13 in a region serving as the Schottky junction region 17b is etched and patterned to form the contact metal film 13, as shown in FIG. 4B.

Thereafter, as shown in FIG. 4C, the Schottky electrode 14 which is in Schottky contact with the N-type semiconductor substrate 11 in the Schottky junction region 17b is provided continuously over the PN junction region 17a and the Schottky junction region 17b, and covers the contact metal film 13.

In this way, the semiconductor device shown in FIG. 4A is obtained.

In the semiconductor device shown in FIG. 4A, the P-type regions 12 having a rectangular shape in sectional view which are formed through ion implantation and heat treatment are buried in the N-type semiconductor substrate 11. For this reason, there is a problem in that the spread of a depletion layer at the time of the backward voltage application indicated by a dotted line in FIG. 4A significantly differs in the depth direction of the N-type semiconductor substrate 11 between the PN junction region 17a and the Schottky junction region 17b, an electric field is concentrated on a corner portion (a region indicated by a dotted-line circle in FIG. 4A) as the boundary between the side surface and the bottom surface of the P-type region 12 with a small thickness of the depletion layer, and a large leak current is easily generated. The leak current is damaging to the reliability of the semiconductor device, thus there is demand for mitigating electric field concentration to suppress the leak current.

In the method of manufacturing a semiconductor device shown in FIGS. 4A to 4C, in order to form the contact metal film 13, the mask is formed on the metal film serving as the contact metal film 13 so as to cover the region which overlaps the P-type region 12 in plan view. If the contact metal film 13 is formed on the N-type semiconductor substrate 11, a leak current is generated. Thus, as shown in FIG. 4B, the contact metal film 13 has a plane area smaller than the P-type region 12 by at least an area taking into consideration the dimension $d_1$ of a positioning margin of the mark for forming the contact metal film 13. The dimension $d_1$ of the positioning margin is determined depending on the positioning precision or the like of an exposure apparatus for use in forming the mask, and is usually about 3 μm.

However, a region which does not overlap the contact metal film 13 on the P-type region 12 becomes an invalid region where ohmic contact with the Schottky electrode 14 cannot be formed in the PN junction region 17a, causing an excess power loss in the semiconductor device. For this reason, in the semiconductor device shown in FIG. 4A, there is demand for reducing a region which does not overlap the contact metal film 13 on the P-type region 12, thereby improving the performance of the semiconductor device.

In the semiconductor device shown in FIG. 4A, the plane area of the contact metal film 13 should be smaller than the P-type region 12 by at least the area taking into consideration the dimension $d_1$ of the positioning margin of the mask for forming the contact metal film 13. This may interfere with microfabrication of the contact metal film 13 and the P-type region 12, making it impossible to secure a sufficient area for the Schottky junction region 17b on the semiconductor device. If the area of the Schottky junction region 17b is small, a forward voltage drop of the semiconductor device may not be sufficiently reduced.

In the method of manufacturing a semiconductor device shown in FIGS. 4A to 4C, there is demand for simplifying a manufacturing process and realizing an efficient manufacturing method with excellent productivity.

The invention has been finalized in consideration of the above-described situation, and an object of the invention is to provide a high-performance semiconductor device capable of suppressing a leak current with little electric field concentration, reducing an invalid region in a PN junction region, securing a sufficient area for a Schottky junction region, and achieving efficient and easy manufacturing.

An object of the invention is to provide a manufacturing method capable of efficiently and easily manufacturing a semiconductor device which is capable of suppressing a leak current with little electric field concentration, reducing an invalid region in a PN junction region, and securing a sufficient area for a Schottky junction region.

Solution to Problem

In order to achieve the above-described object, the invention uses the following configuration.

(1) The invention provides a semiconductor device in which, in one surface of a semiconductor substrate having a first conduction type made of SiC, a PN junction region where a second conduction type layer forms PN junction with the semiconductor substrate and a Schottky junction region where a Schottky electrode is in Schottky contact with the semiconductor substrate are provided. In the PN junction region, a convex portion which has a trapezoidal shape in sectional view and includes the second conduction type layer provided on the semiconductor substrate and a contact layer which is in ohmic contact with the second conduction type layer of the convex portion are provided. The Schottky electrode covers the side surface of the convex portion and the contact layer, and is provided continuously over the PN junction region and the Schottky junction region.

(2) In the semiconductor device described in (1), the angle between the extension direction of the surface of the semiconductor substrate of the Schottky junction region and the extension direction of the side surface of the convex portion is in a range of from 100° to 135°.

(3) In the semiconductor device described in (1) or (2), a region where the semiconductor substrate of the Schottky junction region is in contact with the side surface of the convex portion has a curved surface.

(4) In the semiconductor device described in any one of (1) to (3), the contact layer is provided on the entire upper surface of the second conduction type layer.

(5) In the semiconductor device described in any one of (1) to (4), an ohmic electrode is formed on the other surface of the semiconductor substrate so as to be in ohmic contact with the semiconductor substrate.

(6) In the semiconductor device described in any one of (1) to (5), the semiconductor substrate is constituted by a first SiC layer having the first conduction type and a second SiC layer which is formed on the first SiC layer and contains an impurity having the first conduction type with a lower concentration than the first SiC layer.

(7) The invention provides a method of manufacturing a semiconductor device in which, in one surface of a semiconductor substrate having a first conduction type made of SiC, a PN junction region where a second conduction type layer forms a PN junction with the semiconductor substrate and a Schottky junction region where a Schottky electrode is in Schottky contact with the semiconductor substrate are provided. The method includes a step of forming, on the semiconductor substrate, a PN junction layer having a second conduction type and an ohmic contact layer in ohmic contact with the PN junction layer in that order, an etching step of forming a mask which exposes the Schottky junction region and covers the PN junction region, on the ohmic contact layer, etching at least the ohmic contact layer and the PN junction layer to form a convex portion having a trapezoidal shape in sectional view and including a second conduction type layer constituted by the PN junction layer and a contact layer constituted by the ohmic contact layer on the convex portion in the PN junction region, and removing the mask, and a step of forming the Schottky electrode which is provided continuously over the PN junction region and the Schottky junction region, covers the side surface of the convex portion and the contact layer, and is in Schottky contact with the semiconductor substrate in the Schottky junction region.

(8) In the method described in (6), the etching step is carried out to form the convex portion in which the angle between the extension direction of the surface of the semiconductor substrate of the Schottky junction region and the extension direction of the side surface of the convex portion is in a range of 100° to 135°.

(9) In the method described in (7) or (9), the etching step is carried out such that a region where the semiconductor substrate of the Schottky junction region is in contact with the side surface of the convex portion is curved.

(10) In the method described in any one of (7) to (9), the etching step includes a step of, after etching the ohmic contact layer to expose the PN junction layer, dry-etching the PN junction layer using a mixed gas of $CF_4$ and $O_2$ until the semiconductor substrate is reached to form the convex portion.

(11) In the method described in any one of (7) to (10), the etching step includes a step of, after etching the PN junction layer until the semiconductor substrate is reached, removing the ohmic contact layer, which remains in a region not overlapping the top portion of the convex portion in plan view, through wet etching.

(12) In the method described in any one of claims (7) to (11), in the etching step, the contact layer remains on the entire upper surface of the second conduction type layer.

(13) In the method described in any one of claims (7) to (12), the PN junction layer is formed by an ion implantation method.

(14) In the method described in any one of (7) to (12), the PN junction layer is formed by an epitaxial growth method.

(15) The method described in any one of (7) to (14) further includes a step of providing an ohmic electrode in ohmic contact with the semiconductor substrate in the other surface of the semiconductor substrate.

Advantageous Effects of Invention

In the semiconductor device of the invention, in one surface of the semiconductor substrate having a first conduction type made of SiC, the PN junction region where the second conduction type layer forms a PN junction with the semiconductor substrate and the Schottky junction region where the Schottky electrode is in Schottky contact with the semiconductor substrate are provided. In the PN junction region, the convex portion which has a trapezoidal shape in sectional view and includes the second conduction type layer provided on the semiconductor substrate and the contact layer which is in ohmic contact with the second conduction type layer of the convex portion are provided. The Schottky electrode covers the side surface of the convex portion and the contact layer, and is provided continuously over the PN junction region and the Schottky junction region. Thus, the shape of a PN junction surface of the semiconductor substrate and the second conduction type layer is a planar shape, and a Schottky junction surface of the semiconductor substrate and the Schottky electrode and the PN junction surface are substantially arranged linearly. For this reason, and with regard to the spread of a depletion layer at the time of the backward voltage application, there is little difference in the depth direction of the semiconductor substrate between the PN junction region and the Schottky junction region, and the thickness of the depletion layer is substantially made uniform. Therefore, the semiconductor device of the invention is capable of suppressing the occurrence of a leak current with little electric field concentration and has high reliability.

In the semiconductor device of the invention, in the PN junction region, the convex portion which includes the second conduction type layer provided on the semiconductor substrate and the contact layer which is in ohmic contact with the second conduction type layer of the convex portion are provided. Thus, by the method of forming the PN junction layer having the second conduction type and the ohmic contact layer in ohmic contact with the PN junction layer on the semiconductor substrate in that order, forming the mask, which exposes the Schottky junction region and covers the PN junction region, on the ohmic contact layer, and etching at least the ohmic contact layer and the PN junction layer, the convex portion and the contact layer can be formed in the PN junction region.

Thus, in the semiconductor device of the invention, in forming the contact layer, unlike a case where a mask is formed on a layer serving as the contact layer so as to cover a region which overlaps the second conduction type layer in plan view, it is not necessary to make the plane area of the contact layer smaller than the second conduction type layer by the area taking into consideration the dimension of the positioning margin of the mask for forming the contact layer, and it is possible to reduce a region not overlapping the contact layer on the second conduction type layer. Therefore, it is possible to reduce an invalid region in the PN junction region, realizing a high-performance semiconductor device with low loss.

In the semiconductor device of the invention, it is not necessary to make the planar area of the contact layer smaller than the second conduction type layer by the area taking into consideration the dimension of the positioning margin of the mask for forming the contact layer. Therefore, it becomes easy to microfabricate the contact layer and the second conduction type layer, and it becomes possible to secure a sufficient area for the Schottky junction region and to sufficiently reduce a forward voltage drop of the semiconductor device.

The method of manufacturing a semiconductor device of the invention includes a step of forming, on the semiconductor substrate, a PN junction layer having a second conduction type and an ohmic contact layer in ohmic contact with the PN junction layer in that order, an etching step of forming a mask which exposes the Schottky junction region and covers the PN junction region, on the ohmic contact layer, etching at least the ohmic contact layer and the PN junction layer to form a convex portion having a trapezoidal shape in sectional view and including a second conduction type layer constituted by the PN junction layer and a contact layer constituted by the ohmic contact layer on the convex portion in the PN junction region, and removing the mask, and a step of forming the Schottky electrode which is provided continuously over the PN junction region and the Schottky junction region, covers the side surface of the convex portion and the contact layer, and is in Schottky contact with the semiconductor substrate in the Schottky junction region. Therefore, it is possible to use the mask, which is formed in the etching step, at the time of forming the second conduction type layer and at the time of forming the contact layer, and to simplify the manufacturing process compared to a case where a mask is formed separately at the time of forming the second conduction type layer and at the time of forming the contact layer, achieving efficient manufacturing.

In the method of manufacturing a semiconductor device of the invention, the mask which exposes the Schottky junction region and covers the PN junction region is formed on the ohmic contact layer, and at least the ohmic contact layer and the PN junction layer are etched to form the convex portion including the second conduction type layer constituted by the PN junction layer and the contact layer constituted by the ohmic contact layer on the convex portion in the PN junction region. Therefore, it is not necessary to make the planar area of the contact layer smaller than the second conduction type layer by the area taking into consideration the dimension of the positioning margin of the mask for forming the contact layer, and it is possible to reduce an invalid region in the PN junction region, realizing a high-performance semiconductor device with low loss. It becomes easy to microfabricate the contact layer and the second conduction type layer, and it becomes possible to secure a sufficient area for the Schottky junction region and to sufficiently reduce a forward voltage drop of the semiconductor device.

DESCRIPTION OF EMBODIMENTS

Figure 1A:
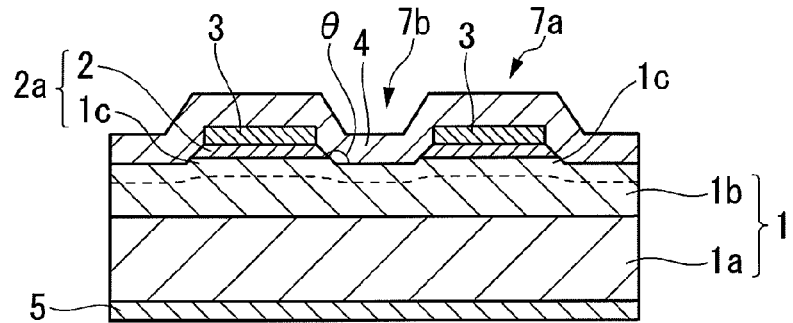
FIG. 1A is a sectional view showing a Schottky bather diode (SBD) which is an example of a semiconductor device of the invention.

Hereinafter, the invention will be described in detail with reference to the drawings. In the following description, the size, thickness, dimension, or the like of each section shown in the drawings to be referenced may be different from the dimensional relationship of an actual semiconductor device.

"Semiconductor Device"

FIG. 1A is a sectional view showing a Schottky barrier diode (SBD) which is an example of a semiconductor device of the invention. FIGS. 1B to 1E are process views illustrating an example of a manufacturing process of the semiconductor device shown in FIG. 1A.

In FIG. 1A, reference numeral 1 denotes an N-type (first conduction type) semiconductor substrate.

The semiconductor substrate 1 has an N$^-$SiC layer 1b (second SiC layer) which is provided by growing an N$^-$-type epitaxial layer on an N$^+$SiC layer 1a (first SiC layer) having low resistance. The N$^-$SiC layer 1b contains an N-type impurity with a lower concentration than the N$^-$SiC layer 1a.

In the surface (one surface) of the semiconductor substrate 1 on the N$^-$SiC layer 1b side, a PN junction region 7a where a P-type layer 2 (second conduction type layer) forms a PN junction with the semiconductor substrate 1 and a Schottky junction region 7b where a Schottky electrode 4 is in Schottky contact with the semiconductor substrate 1 are provided.

As shown in FIG. 1A, in the PN junction region 7a, a convex portion 2a having a trapezoidal shape in sectional view and a contact layer 3 are provided. In this embodiment, the convex portion 2a is constituted by the semiconductor substrate 1, and is formed of a convex portion 1c which has a trapezoidal shape in sectional view and is formed to protrude from the surface of the semiconductor substrate 1 on the N$^-$SiC layer 1b side and a P-type layer 2 which has a trapezoidal shape in sectional view and is provided in the entire top portion of the convex portion 1c. The P-type layer 2 is formed by implanting and diffusing a P-type impurity, such as Al or B, into the N$^-$SiC layer 1b of the semiconductor substrate 1.

It is preferable that the angle θ between the extension direction of the surface of the semiconductor substrate 1 in the Schottky junction region 7a and the extension direction of the side surface of the convex portion 2a becomes an obtuse angle and is in a range of 100° to 135°. When the angle θ is in a range of 100° to 135°, it is possible to more effectively prevent electric field concentration and to effectively suppress the occurrence of a leak current, achieving higher reliability. It is possible to effectively prevent the Schottky electrode 4 from being defectively formed due to a step between the convex portion 2a and the contact layer 3, and also to sufficiently reduce a region not overlapping the contact layer 3 on the P-type layer 2. As the angle θ is close to 180°, it is possible to effectively prevent the occurrence of a leak current or defective formation due to a step. As the angle θ is close to 90°, it is possible to reduce the size of a region not overlapping the contact layer 3 on the P-type layer 2, and also to reduce an invalid region in the PN junction region.

As shown in FIG. 1A, the contact layer 3 is formed on the entire surface (upper surface) of the P-type layer 2 on the contact layer 3 side and is in ohmic contact with the P-type layer 2 of the convex portion 2a. The contact layer 3 forms ohmic contact with the P-type layer 2 and is made of a metal, such as an alloy containing Ti and Al. When the contact layer 3 is made of an alloy containing Ti and Al, the resistance value of the contact layer 3 is sufficiently low, and the contact layer 3 forms a satisfactory ohmic junction with the P-type layer 2.

As shown in FIG. 1A, the Schottky electrode 4 covers the side surface of the convex portion 2a and the side and upper surfaces of the contact layer 3, and is provided continuously over the PN junction region 7a and the Schottky junction region 7b. In the semiconductor device shown in FIG. 1A, the contact layer 3 is arranged between the P-type layer 2 and the Schottky electrode 4 in the PN junction region 7a. The Schottky electrode 4 is made of a metal, such as Mo or Ti, and preferably, is made of a metal primarily containing Mo. When the Schottky electrode 4 is made of a metal primarily containing Mo, the Schottky electrode 4 is satisfactorily in Schottky contact with the N$^-$SiC layer 1b of the semiconductor substrate 1.

When the contact layer 3 is made of an alloy containing Ti and Al, and the Schottky electrode 4 is made of a metal primarily containing Mo, satisfactory electrical contact is obtained between the contact layer 3 and the Schottky electrode 4.

In the surface of the Schottky electrode 4 opposite to the semiconductor substrate 1 (in FIG. 1A, the surface on the upper side), a front pad electrode (not shown) made of a metal containing Al is formed. A passivation film (not shown) having a predetermined shape made of a photosensitive polyimide film or the like is formed on the front pad electrode.

As shown in FIG. 1A, in the surface (the other surface) of the semiconductor substrate 1 on the N$^+$SiC layer 1a side, an ohmic electrode 5 which is in ohmic contact with the N$^+$SiC layer 1a of the semiconductor substrate 1 is provided. The ohmic electrode 5 is made of a metal, such as a metal primarily containing Ni.

In the surface of the ohmic electrode 5 opposite to the semiconductor substrate 1 (in FIG. 1A, the surface on the lower side), a rear pad electrode (not shown) made of a metal, such as an Ni layer and an Ag layer, is formed.

"Method of Manufacturing Semiconductor Device"

The semiconductor device shown in FIG. 1A can be manufactured by, for example, the following method.

First, an N$^-$-type epitaxial layer is grown on a semiconductor substrate constituted by the N$^+$SiC layer 1a to form the N$^-$SiC layer 1b, thereby obtaining the N-type semiconductor substrate 1 having the N$^-$SiC layer 1b on the N$^+$SiC layer 1a.

Next, a PN junction layer (not shown) is formed on the N$^-$SiC layer 1b of the semiconductor substrate 1 by an ion implantation method. Specifically, for example, a P-type impurity, such as Al or B, is ion-implanted into a desired region on the N$^-$SiC layer 1b of the semiconductor substrate 1 with an oxide film formed by a CVD (Chemical Vapor Deposition) method as a mask. Thereafter, the mask made of an oxide film is removed.

Next, heat treatment is carried out at high temperature so as to diffuse and activate the P-type impurity ion-implanted into the semiconductor substrate 1. Here, the heat treatment is carried out at a temperature of about 1700° C. in an inert gas atmosphere, such as Ar, or in vacuum. Thus, a P-type PN junction layer which forms a PN junction with the N$^-$SiC layer 1b of the semiconductor substrate 1 is formed in a desired region on the semiconductor substrate 1.

Thereafter, in the surface of the semiconductor substrate 1 on the N$^+$SiC layer 1a side, for example, a metal film made of a metal primarily containing Ni is formed by a sputtering method. Next, in order to obtain satisfactory ohmic contact, for example, heat treatment is carried out at a temperature of about 1000° C. in an inert gas atmosphere, such as Ar.

Figure 1B:
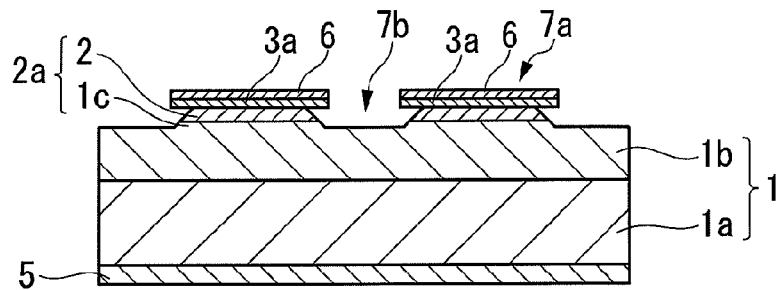
FIG. 1B is a process view illustrating an example of a manufacturing process of a semiconductor device.

Thus, as shown in FIG. 1B, the ohmic electrode 5 which is in ohmic contact with the N$^-$SiC layer 1a of the semiconductor substrate 1 is formed.

Thereafter, in the surface of the semiconductor substrate 1 on the N$^-$SiC layer 1b side on which the PN junction layer is formed, for example, a metal film made of an alloy containing Ti and Al is formed by a sputtering method. Next, in order to obtain satisfactory ohmic contact, for example, heat treatment is carried out at a temperature of about 900° C. in an inert gas atmosphere, such as Ar. Thus, an ohmic contact layer 3a which is in ohmic contact with the PN junction layer is formed.

(Etching Process)

Next, an etching process is performed for etching the ohmic contact layer 3a, the PN junction layer, and a part of the N$^-$SiC layer 1b of the semiconductor substrate 1.

In the etching process, first, a resist layer is formed on the ohmic contact layer 3a and patterned by a lithography technique to form a mask 6 which has a resist pattern to expose the Schottky junction region 7b and to cover the PN junction region 7a, as shown in FIG. 1B.

Thereafter, the ohmic contact layer 3a is etched by, for example, dry etching, such as RIE (Reactive Ion Etching) using a Cl gas, to expose the PN junction layer of the Schottky junction region 7b.

Next, the PN junction layer and a part of the N$^-$SiC layer 1b of the semiconductor substrate 1 are dry-etched using, for example, a mixed gas of CF$_4$ and O$_2$. At this time, by a method or the like which adjusts the etching conditions, such as an etching rate, as shown in FIG. 1B, the convex portion 1c and the convex portion 2a are formed in the PN junction region 7a. The convex portion 1c is formed of the N$^-$SiC layer 1b of the semiconductor substrate 1. The convex portion 2a has a trapezoidal shape in sectional view and is formed of the P-type layer 2 constituted by the PN junction layer such that the angle θ between the extension direction of the surface of the semiconductor substrate 1 in the Schottky junction region 7a and the extension direction of the side surface of the convex portion 2a is in a range of 100° to 135°.

Although in this embodiment, an example has been described where a part of the N$^-$SiC layer 1b is removed by dry etching along with the PN junction layer to form the convex portion 2a including a part of the N$^-$SiC layer 1b of the semiconductor substrate 1, it should suffice that dry etching can remove the PN junction layer until at least the semiconductor substrate 1 is reached. Thus, at the time of dry etching, the semiconductor substrate 1 may not be removed. Meanwhile, in order to completely remove the PN junction layer of the Schottky junction region 7b, it is preferable that a part of the N$^-$SiC layer 1b is removed. However, if the thickness of the N$^-$SiC layer 1b to be removed is large, a step is formed between the Schottky junction surface of the semiconductor substrate 1 and the Schottky electrode 4 and the PN junction surface of the semiconductor substrate 1 and the P-type layer 2, causing electric field concentration. Therefore, it is preferable that the thickness of the N$^-$SiC layer 1b to be removed is as small as possible within a range such that the PN junction layer of the Schottky junction region 7b can be completely removed. At the time of dry etching, when the semiconductor substrate 1 is not removed, the convex portion 2a is formed of only the P-type layer 2.

Figure 1C:
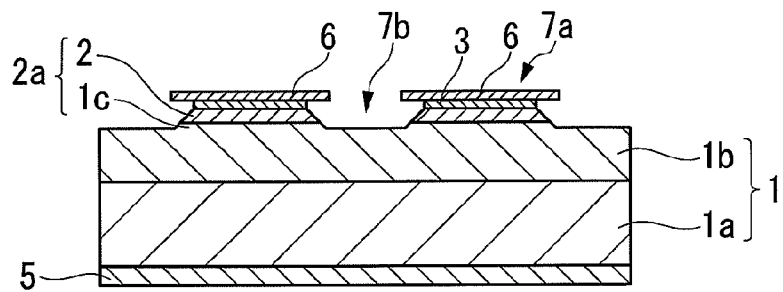
FIG. 1C is a process view illustrating an example of a manufacturing process of a semiconductor device.

After the convex portion 2a is formed in the above-described manner, the ohmic contact layer 3a which remains in a region not overlapping the top portion of the convex portion 2a in plan view is removed by wet etching. At the time of wet etching, as shown in FIG. 1C, the ohmic contact layer 3a remains on the entire surface of the P-type layer 2. Thus, in the PN junction region 7a, the contact layer 3 which is formed of the ohmic contact layer 3a is formed on the entire surface of the P-type layer 2 forming the convex portion 2a on the contact layer 3 side.

Figure 1D:
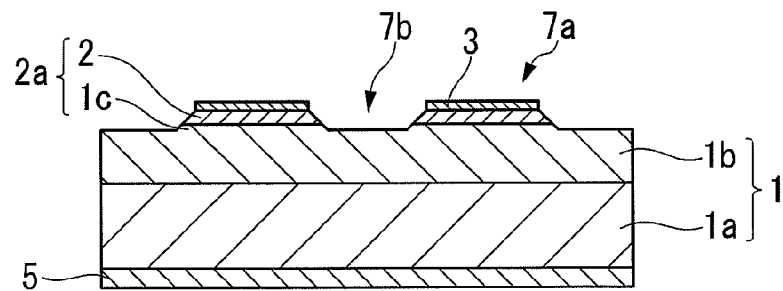
FIG. 1D is a process view illustrating an example of a manufacturing process of a semiconductor device.

Thereafter, as shown in FIG. 1D, the mask 6 is removed.

Figure 1E:
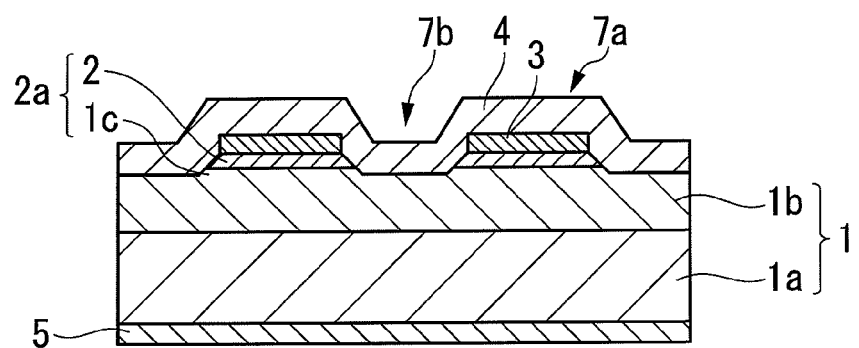
FIG. 1E is a process view illustrating an example of a manufacturing process of a semiconductor device.

Subsequently, in the surface of the semiconductor substrate 1 on the N$^-$SiC layer 1b side shown in FIG. 1D on which the respective layers to the contact layer 3 are formed, a metal film made of a metal, such as Mo or Ti, is formed by an evaporation method or a sputtering method as the metal film which becomes the Schottky electrode 4. Next, a resist layer is formed on the metal film which becomes the Schottky electrode 4 and patterned by a lithography technique to form a mask which has a resist pattern. Thereafter, the metal film which becomes the Schottky electrode 4 is wet-etched and patterned to have a shape which is provided continuously over the PN junction region 7a and the Schottky junction region 7b, and covers the side surface of the convex portion 2a and the side and upper surfaces of the contact layer 3. Thereafter, in order to control a Schottky barrier height (φB), for example, heat treatment is carried out at a temperature of about 600° C. in an inert gas atmosphere, such as Ar, to form the Schottky electrode 4 which is in Schottky contact with the N$^-$SiC layer 1b of the semiconductor substrate 1 in the Schottky junction region 7b, as shown in FIG. 1E.

Next, a metal film, such as Al, is formed on the Schottky electrode 4 by a sputtering method or the like as the metal film which becomes the front pad electrode, and etching is carried out using the mask having the resist pattern to form the front pad electrode (not shown) having a predetermined shape.

Thereafter, a photosensitive polyimide film is coated on the front pad electrode, and exposed and developed with a desired pattern to form the passivation film (not shown) having a predetermined shape.

Subsequently, in the surface of the ohmic electrode 5 opposite to the semiconductor substrate 1 (in FIG. 1A, the surface on the lower side), a metal film made of, for example, an Ni layer and an Ag layer is formed by a sputtering method to from the rear pad electrode (not shown).

In this way, the semiconductor device shown in FIG. 1A is obtained.

In the semiconductor device shown in FIG. 1A, in the surface of the semiconductor substrate 1 on the N⁻SiC layer 1b side, the PN junction region 7a where the P-type layer 2 forms a PN junction with the semiconductor substrate 1 and the Schottky junction region 7b where the Schottky electrode 4 is in Schottky contact with the semiconductor substrate 1 are provided. In the PN junction region 7a, the convex portion 2a which has a trapezoidal shape in sectional view and includes the P-type layer 2 provided on the semiconductor substrate 1 and the contact layer 3 which is in ohmic contact with the P-type layer 2 of the convex portion 2a are provided. The Schottky electrode 4 covers the side surface of the convex portion 2a and the contact layer 3, and is provided continuously over the PN junction region 7a and the Schottky junction region 7b. For this reason, the shape of the PN junction surface of the semiconductor substrate 1 and the P-type layer 2 becomes a planar shape, and the Schottky junction surface of the semiconductor substrate 1 and the Schottky electrode 4 and the PN junction surface are substantially arranged linearly. Thus, in the semiconductor device of this embodiment, as indicated by a dotted line in FIG. 1A, with regard to the spread of the depletion layer at the time of the backward current voltage application, there is little difference in the depth direction of the semiconductor substrate 1 between the PN junction region 7a and the Schottky junction region 7b. Therefore, the semiconductor device of this embodiment is capable of suppressing the occurrence of a leak current with little electric field concentration and has high reliability.

In the semiconductor device shown in FIG. 1A, in the PN junction region 7a, the convex portion 2a which includes the P-type layer 2 provided on the semiconductor substrate 1 and the contact layer 3 which is in ohmic contact with the P-type layer 2 of the convex portion 2a are provided. Therefore, by the method of forming the PN junction layer having a second conduction type and the ohmic contact layer 3a in ohmic contact with the PN junction layer on the semiconductor substrate 1 in that order, forming the mask 6, which exposes the Schottky junction region 7b and covers the PN junction region 7a, on the ohmic contact layer 3a, and etching at least the ohmic contact layer 3a and the PN junction layer, it is possible to form the convex portion 2a and the contact layer 3 in the PN junction region 7a.

Thus, in the semiconductor device shown in FIG. 1A, it is not necessary to make the plane area of the contact layer 3 smaller than the P-type layer 2 by the area taking into consideration the dimension of the positioning margin of the mask for forming the contact layer 3, and it is possible to reduce a region not overlapping the contact layer 3 on the P-type layer 2. Therefore, it is possible to reduce an invalid region in the PN junction region 7a, realizing a high-performance semiconductor device with low loss.

In the semiconductor device shown in FIG. 1A, the contact layer 3 is provided on the entire surface of the P-type layer 2 on the contact layer 3 side. Therefore, an invalid region in the PN junction region 7a is very small, realizing a higher-performance semiconductor device with lower loss.

In the semiconductor device shown in FIG. 1A, it is not necessary to make the plane area of the contact layer 3 smaller than the P-type layer 2 by the area taking into consideration the dimension of the positioning margin of the mask for forming the contact layer 3. Therefore, it becomes easy to microfabricate the contact layer 3 and the P-type layer 2, and it becomes possible to secure a sufficient area for the Schottky junction region 7b and to sufficiently reduce a forward voltage drop of the semiconductor device.

According to the method of manufacturing a semiconductor device of this embodiment, a single mask is formed in etching the ohmic contact layer 3a, the PN junction layer, and a part of the N⁻SiC layer 1b of the semiconductor substrate 1. For this reason, it is possible to simplify the manufacturing process compared to a case where a mask is formed separately at the time of etching the ohmic contact layer 3a, the PN junction layer, and the N⁻SiC layer 1b, achieving efficient manufacturing.

"Others"

Figure 2:
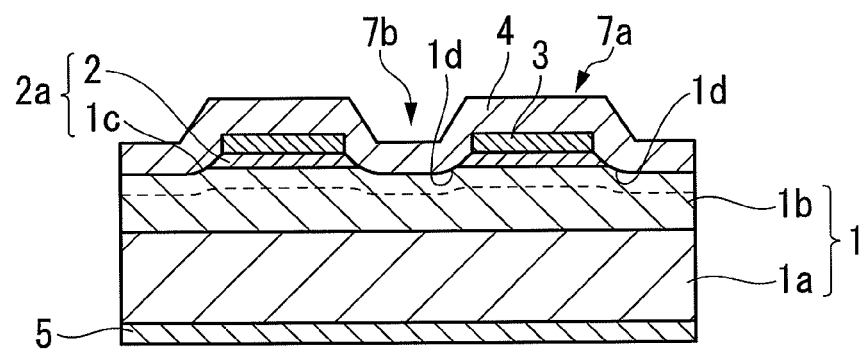
FIG. 2 is a sectional view showing a Schottky barrier diode (SBD) which is another example of a semiconductor device of the invention.

The semiconductor device of the invention is not limited to the above-described embodiment, and may be, for example, a semiconductor device shown in FIG. 2. FIG. 2 is a sectional view showing a Schottky barrier diode (SBD) which is another example of a semiconductor device of the invention.

The semiconductor device shown in FIG. 2 is different from the semiconductor device shown in FIG. 1A only in that a region 1d where the semiconductor substrate 1 in the Schottky junction region 7b is in contact with the side surface of the convex portion 2a substantially has a planar surface in the semiconductor device shown in FIG. 1A but has a curved surface in the semiconductor device shown in FIG. 2. Therefore, in the semiconductor device shown in FIG. 2, the same members as those in the semiconductor device shown in FIG. 1A are represented by the same reference numerals, and description thereof will be omitted.

The semiconductor device shown in FIG. 2 can be manufactured in the same manner as the semiconductor device shown in FIG. 1A except that, in the etching process, the region 1d where the semiconductor substrate 1 in the Schottky junction region 7b is in contact with the side surface of the convex portion 2a is curved by a method or the like which adjusts the etching conditions, such as the etching rate.

In the semiconductor device shown in FIG. 2, the region 1d where the semiconductor substrate 1 in the Schottky junction region 7b is in contact with the side surface of the convex portion 2a is constituted by a curved surface. For this reason, the region 1d where the semiconductor substrate 1 in the Schottky junction region 7b is in contact with the side surface of the convex portion 2a is arced (electrically arced), and electric field concentration in the region 1d where the semiconductor substrate 1 in the Schottky junction region 7b is in contact with the side surface of the convex portion 2a is mitigated. Thus, as indicated by a dotted line in FIG. 2, with regard to the spread of the depletion layer at the time of the backward voltage application, the difference in the depth direction of the semiconductor substrate 1 between the PN junction region 7a and the Schottky junction region 7b is further reduced, such that the thickness of the depletion layer is made more uniform. Therefore, according to the semiconductor device of this embodiment, it is possible to more effectively suppress the occurrence of a leak current in the edge portion of the Schottky junction region 7b, further improving reliability.

In the semiconductor device shown in FIG. 2, similarly to the semiconductor device shown in FIG. 1A, it is not necessary to make the plane area of the contact layer 3 smaller than the P-type layer 2 by the area taking into consideration the dimension of the positioning margin of the mask for forming the contact layer 3. Thus, it is possible to reduce a region not overlapping the contact layer 3 on the P-type layer 2 and to reduce an invalid region in the PN junction region 7a, realizing a high-performance semiconductor device with low loss. It becomes easy to microfabricate the contact layer 3 and the P-type layer 2, and it becomes possible to secure a sufficient area for the Schottky junction region 7b and to sufficiently reduce a forward voltage drop of the semiconductor device.

In the method of manufacturing a semiconductor device shown in FIG. 2, similarly to the method of manufacturing a semiconductor device shown in FIG. 1A, a single mask is formed in etching the ohmic contact layer 3a, the PN junction layer, and a part of the N⁻SiC layer 1b of the semiconductor substrate 1, achieving easy and efficient manufacturing.

Although in the above-described embodiment, for example, a method has been described in which the PN junction layer serving as the P-type layer 2 is formed by an ion implantation method, the PN junction layer serving as the P-type layer 2 may be formed by an epitaxial growth method.

EXAMPLES

Hereinafter, the invention will be specifically described on the basis of Examples. However, the invention is not limited to Examples.

Example 1

A Schottky bather diode of Example 1 shown in FIG. 1A was manufactured in the following manner. First, an N⁻-type epitaxial layer was grown on the semiconductor substrate 1 constituted by the N⁺SiC layer 1a with an impurity concentration of 2E 18 $cm^{-3}$ to form the N⁻SiC layer 1b with an impurity concentration of 1E16 $cm^{-3}$, obtaining the N-type semiconductor substrate 1 having the N⁺SiC layer 1a and the N⁻SiC layer 1b. Next, the PN junction layer (not shown) was formed on the N⁻SiC layer 1b of the semiconductor substrate 1 by an ion implantation method. Specifically, a P-type impurity made of aluminum was ion-implanted into the N⁻SiC layer 1b of the semiconductor substrate 1 at a temperature of 600° C. so as to have an impurity concentration of 2E19 $cm^{-3}$ with an oxide film formed by a CVD (Chemical Vapor Deposition) method as a mask. Thereafter, the mask made of an oxide film was removed.

Next, in order to diffuse and activate the P-type impurity ion-implanted into the semiconductor substrate 1, heat treatment was carried out. Here, the heat treatment was carried out at a temperature of 1700° C. in an Ar gas atmosphere. Thus, the P-type PN junction layer forming a PN junction with the N⁻SiC layer 1b was formed in a desired region on the semiconductor substrate 1.

Thereafter, in the surface of the semiconductor substrate 1 on the N⁺SiC layer 1a side, a metal film made of Ni was formed by a sputtering method, and in order to obtain satisfactory ohmic contact, heat treatment was carried out at a temperature of 1000° C. in an Ar gas atmosphere, such that the ohmic electrode 5 in ohmic contact with the N⁺SiC layer 1a of the semiconductor substrate 1 was formed.

Thereafter, in the surface of the semiconductor substrate 1 on the N⁻SiC layer 1b side, a metal film made of an alloy containing Ti and Al was formed by a sputtering method, and in order to obtain satisfactory ohmic contact, heat treatment was performed at a temperature of 900° C. in an Ar gas atmosphere, such that the ohmic contact layer 3a in ohmic contact with the PN junction layer was formed.

(Etching Process)

Next, the mask 6 which has a resist pattern to expose the Schottky junction region 7b and to cover the PN junction region 7a was formed on the ohmic contact layer 3a, and the ohmic contact layer 3a was etched by RIE using a Cl gas to expose the PN junction layer of the Schottky junction region 7b.

Next, the PN junction layer and a part of the N⁻SiC layer 1b of the semiconductor substrate 1 were dry-etched using a mixed gas of $CF_4$ and $O_2$ to form, in the PN junction region 7a, the convex portion 1c which is formed of the N⁻SiC layer 1b and the convex portion 2a which has a trapezoidal shape in sectional view and is formed of the P-type layer 2 constituted by the PN junction layer such that the angle between the extension direction of the surface of the semiconductor substrate 1 in the Schottky junction region 7a and the extension direction of the side surface of the convex portion 2a is 100°. A region where the semiconductor substrate 1 in the Schottky junction region 7b is in contact with the side surface of the convex portion 2a substantially had a planar surface. With regard to the resultant P-type layer 2, the interval between adjacent P-type layers 2 was 5 μm.

After the convex portion 2a was formed in the above-described manner, the ohmic contact layer 3a which remains in a region not overlapping the top portion of the convex portion 2a in plan view was removed by wet etching to form the contact layer 3 constituted by the ohmic contact layer 3a on the entire surface of the P-type layer 2 on the contact layer 3 side in the PN junction region 7a. Thereafter, the mask 6 was removed.

Subsequently, in the surface of the semiconductor substrate 1 on the N⁻SiC layer 1b side, a metal film made of Mo was formed by an evaporation method and patterned by wet etching using a mask having a resist pattern to have a shape which is provided continuously over the PN junction region 7a and the Schottky junction region 7b, and covers the side surface of the convex portion 2a and the side and upper surfaces of the contact layer 3. Thereafter, in order to control the Schottky barrier height (φB), heat treatment was carried out at a temperature of 600° C. in an Ar gas atmosphere to form the Schottky electrode 4 in Schottky contact with the N⁻SiC layer 1b in the Schottky junction region 7b.

Next, an Al film was formed on the Schottky electrode 4 by a sputtering method and etched using a mask having a resist pattern to form the front pad electrode having a predetermined shape. Thereafter, a photosensitive polyimide film was coated on the front pad electrode, and exposed and developed with a desired pattern to form the passivation film having a predetermined shape.

Subsequently, in the surface of the ohmic electrode 5 opposite to the semiconductor substrate 1, a metal film made of an Ni layer and an Ag layer was formed by a sputtering method to form the rear pad electrode.

In this way, the semiconductor device of Example 1 was obtained.

Comparative Example

Figure 4A:
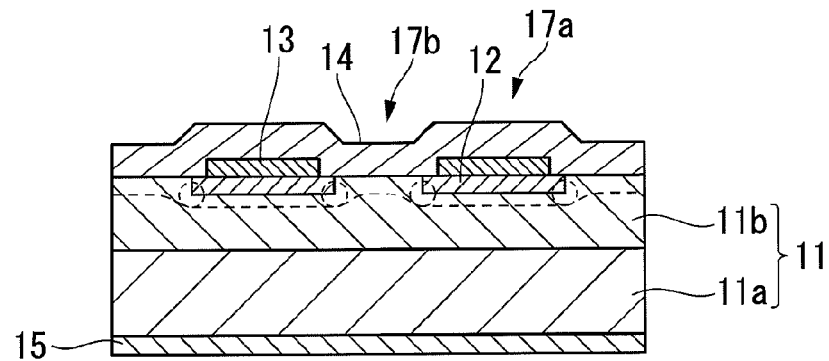
FIG. 4A is a sectional view showing an example of a semiconductor device of the related art.
Figure 4B:
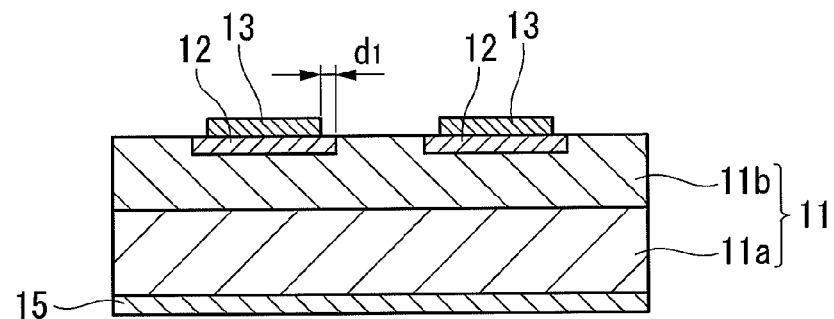
FIG. 4B is a process view illustrating an example of a manufacturing process of a semiconductor device.
Figure 4C:
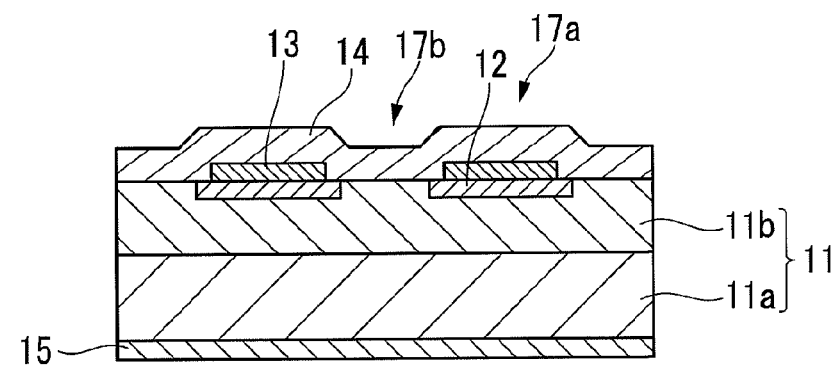
FIG. 4C is a process view illustrating an example of a manufacturing process of a semiconductor device.

A Schottky bather diode of Comparative Example shown in FIG. 4A was manufactured in the following manner.

First, in the same manner as in Example 1, the N-type semiconductor substrate 11 having the N⁺SiC layer 11a and the N⁻SiC layer 11b was obtained. Then, after a mask was formed on the N-type semiconductor substrate 11, as in Example 1, a P-type impurity was ion-implanted and heat treatment was carried out to form the P-type region 12 which has a rectangular shape in sectional view and is buried in the PN junction region 17a of the N-type semiconductor substrate 11. With regard to the resultant P-type region 12, the interval between adjacent P-type regions 12 was 5 μm.

Thereafter, in the same manner as in Example 1, the ohmic electrode 15 was formed.

Subsequently, the same metal film as the contact layer 3 of Example 1 was formed on the P-type region 12, and heat treatment was carried out in the same manner as in Example 1. Next, a mask which covers a region overlapping the P-type region 12 in plan view was formed on the metal film and the metal film was patterned by etching to form the contact metal film 13. The dimension $d_1$ of the positioning margin of the mask for forming the metal film was 3 μm.

Thereafter, in the same manner as the Schottky electrode 4 of Example 1, the Schottky electrode 14 which is provided continuously over the PN junction region 17a and the Schottky junction region 17b, covers the contact metal film 13, and is in Schottky contact with the N-type semiconductor substrate 11 in the Schottky junction region 17b was formed.

Thereafter, in the same manner as in Example 1, the front pad electrode, the passivation film, and the rear pad electrode were formed.

In this way, the semiconductor device of the Comparative Example was obtained.

The dimension between adjacent contact layers 3 (contact metal films 13) obtained in the above-described manner in Example 1 and Comparative Example was examined.

As a result, the dimension was 6 μm in Example and 11 μm in the Comparative Example.

Figure 3A:
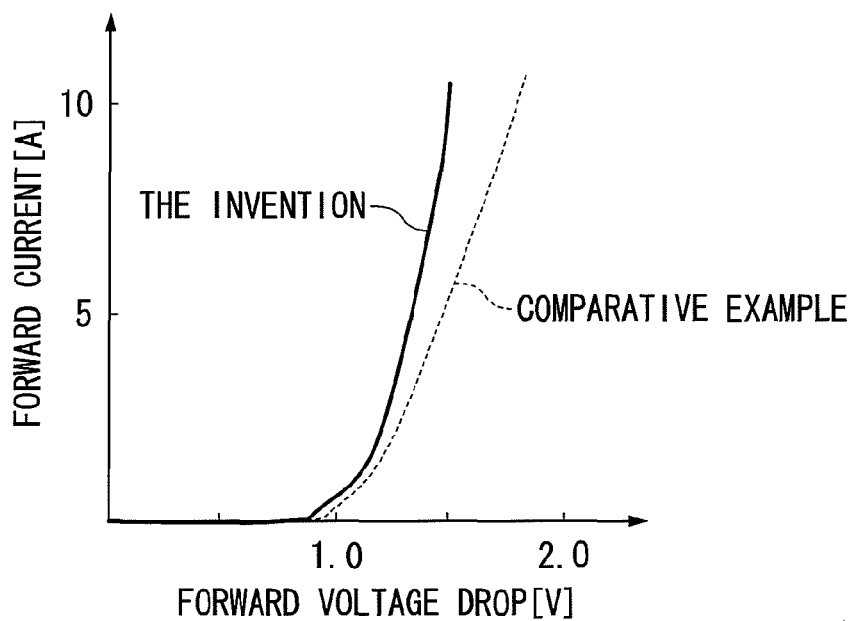
FIG. 3A is a graph showing a relationship between a forward current and a forward voltage drop in semiconductor devices of Example 1 and Comparative Example.

The relationship between a forward current and a forward voltage drop in the semiconductor devices of Example 1 and the Comparative Example was examined. The result is shown in FIG. 3A. FIG. 3A is a graph showing the relationship between a forward current and a forward voltage drop in the semiconductor devices of Example 1 and the Comparative Example.

As shown in FIG. 3A, in Example 1, a forward voltage drop is reduced compared to the Comparative Example. This is because, in Example, it was possible to miniaturize the contact layer 3 and the P-type layer 2, to increase the dimension between the contact layers 3 (contact metal films 13), and to secure a sufficient area for the Schottky junction region 7b compared to the Comparative Example.

Example 2

A Schottky barrier diode of Example 2 shown in FIG. 2 was manufactured in the following manner.

That is, the semiconductor device of Example 2 was obtained in the same manner as in Example 1 except that, in the etching process, the region 1d where the semiconductor substrate 1 of the Schottky junction region 7b is in contact with the side surface of the convex portion 2a has a curved surface by the method or the like which adjusts the etching conditions, such as the etching rate.

Figure 3B:
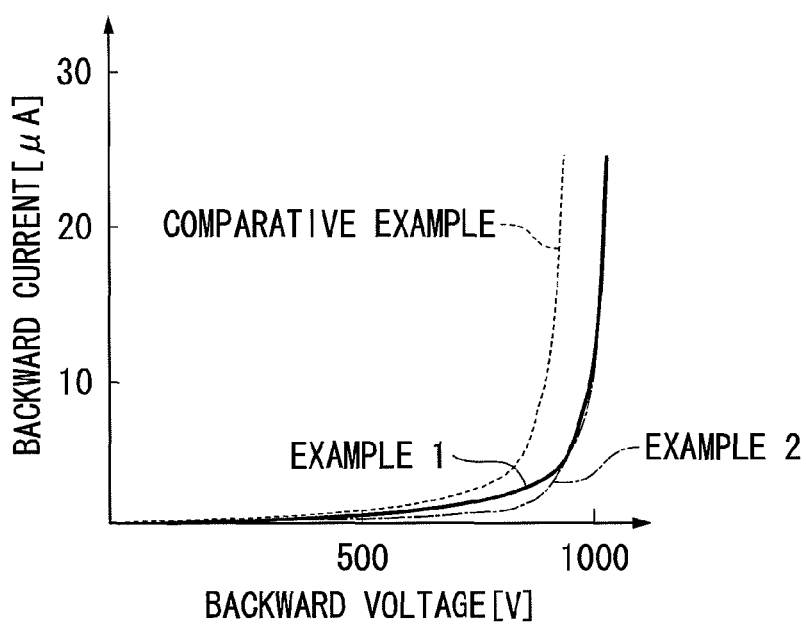
FIG. 3B is a graph showing a relationship between a backward current and a backward voltage in semiconductor devices of Example 2 and Comparative Example.

The relationship between a backward current and a backward voltage in the semiconductor devices of Example 2, Example 1, and Comparative Example obtained in the above-described manner was examined. The result is shown in FIG. 3B. FIG. 3B is a graph showing the relationship between a backward current and a backward voltage in the semiconductor devices of Example 2, Example 1, and the Comparative Example.

As shown in FIG. 3B, in Example 2 and Example 1, a backward voltage drop increases, electric field concentration hardly occurs, and a leak current is small compared to the Comparative Example.

In Example 2 in which the region 1d where the semiconductor substrate 1 in the Schottky junction region 7b is in contact with the side surface of the convex portion 2a is curved, it can be understood that a backward voltage drop increases compared to Example 1, and a leak current is small.

INDUSTRIAL APPLICABILITY

The invention can be applied to a semiconductor device and a method of manufacturing a semiconductor device, and in particular, to a semiconductor device which is appropriated used for a power semiconductor device and a method of manufacturing a semiconductor device.

REFERENCE SIGNS LIST

1: semiconductor substrate
11: N-type semiconductor substrate
1a, 11a: N$^+$SiC layer
1b, 11b: N$^-$SiC layer
1c: convex portion
2: P-type layer (second conduction type layer)
2a: convex portion
3: contact layer
3a: ohmic contact layer
4, 14: Schottky electrode
5, 15: ohmic electrode
6: mask
7a, 17a: PN junction region
7b, 17b: Schottky junction region
12: P-type region
13: contact metal film

The invention claimed is:

1. A method of manufacturing a semiconductor device having, a substrate having a first conduction type made of SiC, a PN junction region where a second conduction type layer forms a PN junction with the semiconductor substrate and a Schottky junction region where a Schottky electrode is in Schottky contact with the semiconductor substrate, in one surface of the semiconductor substrate, comprising:
  a step of forming, on the semiconductor substrate, a PN junction layer having a second conduction type and an ohmic contact layer in ohmic contact with the PN junction layer in that order;
  an etching step of forming a mask which exposes the Schottky junction region and covers the PN junction region, on the ohmic contact layer, etching the ohmic contact layer, the PN junction layer, and a part of the substrate to form a convex portion having a trapezoidal shape in sectional view and including a second conduction type layer constituted by the PN junction layer and a part of the semiconductor substrate, and a contact layer constituted by the ohmic contact layer on the convex portion in the PN junction region, and removing the mask; and
  a step of forming the Schottky electrode which is provided continuously over the PN junction region and the Schottky junction region, covers the side surface of the convex portion and the contact layer, and is in Schottky contact with the semiconductor substrate in the Schottky junction region,
  wherein the etching step includes a step of, after etching the ohmic contact layer to expose the PN junction layer, dry-etching the PN junction layer until the semiconductor substrate is reached to form the convex portion, and then removing the ohmic contact layer, which remains in a region not overlapping the top portion of the convex portion in plan view, through wet etching.

2. The method according to claim 1,
  wherein the etching step is carried out to form the convex portion in which the angle between the extension direction of the surface of the semiconductor substrate of the Schottky junction region and the extension direction of the side surface of the convex portion is in a range of 100° to 135°.

3. The method according to claim 1,
wherein the etching step is carried out such that a region where the semiconductor substrate of the Schottky junction region is in contact with the side surface of the convex portion is curved.

4. The method according to claim 1,
wherein the step of dry-etching the PN junction layer uses a mixed gas of $CF_4$ and $O_2$.

5. The method according to claim 1,
wherein, in the etching step, the contact layer remains on the entire upper surface of the second conduction type layer.

6. The method according to claim 1,
wherein the PN junction layer is formed by an ion implantation method.

7. The method according to claim 1,
wherein the PN junction layer is formed by an epitaxial growth method.

8. The method according to claim 1, further comprising:
a step of providing an ohmic electrode in ohmic contact with the semiconductor substrate in the other surface of the semiconductor substrate.

* * * * *